United States Patent [19]

Kuehnert

[11] Patent Number: 4,643,415
[45] Date of Patent: Feb. 17, 1987

[54] APPARATUS FOR THE AUTOMATIC FEEDING OF A LAMINATING STATION

[75] Inventor: Hans-Guenter E. Kuehnert, Erzhausen, Fed. Rep. of Germany

[73] Assignee: Hoechst Aktiengesellschaft, Frankfurt am Main, Fed. Rep. of Germany

[21] Appl. No.: 740,554

[22] Filed: Jun. 3, 1985

[30] Foreign Application Priority Data

Jun. 1, 1984 [DE] Fed. Rep. of Germany ....... 3420426
Mar. 23, 1985 [DE] Fed. Rep. of Germany ....... 3510579

[51] Int. Cl.$^4$ ............................................. B65H 5/10
[52] U.S. Cl. ..................................... 271/268; 271/85; 271/265; 226/158
[58] Field of Search ................. 271/85, 132, 228, 267, 271/268, 99, 265; 198/468.2; 414/751, 752, 753, 740; 294/88, DIG. 2; 226/158, 159, 162, 167; 156/351, 302, 361–364

[56] References Cited

U.S. PATENT DOCUMENTS

| | | | |
|---|---|---|---|
| 2,578,779 | 12/1951 | Black | 271/267 |
| 3,412,995 | 11/1968 | Parups | 226/158 |
| 3,937,379 | 2/1976 | Narwid et al. | 226/159 |
| 3,947,016 | 3/1976 | Horung et al. | 271/265 |
| 3,994,490 | 11/1976 | Smiltneek | 271/136 |
| 4,022,367 | 5/1977 | Sporenberg et al. | 226/158 |
| 4,214,936 | 7/1980 | Del Bianco | 156/302 |
| 4,284,301 | 8/1981 | Geiger et al. | 271/268 |
| 4,338,152 | 7/1982 | Del Bianco et al. | 226/162 |
| 4,448,056 | 5/1984 | Baba | 414/753 |
| 4,526,100 | 7/1985 | Brasa | 271/85 |

FOREIGN PATENT DOCUMENTS

| | | |
|---|---|---|
| 0040842 | 12/1981 | European Pat. Off. . |
| 0040843 | 12/1981 | European Pat. Off. . |
| 0041642 | 12/1981 | European Pat. Off. . |
| 0058421 | 8/1982 | European Pat. Off. . |
| 0084077 | 7/1983 | European Pat. Off. . |
| 0592496 | 2/1978 | U.S.S.R. ............... 226/162 |

*Primary Examiner*—Duane A. Reger
*Assistant Examiner*—James E. Barlow
*Attorney, Agent, or Firm*—Schwartz, Jeffery, Schwaab, Mack, Blumenthal & Evans

[57] ABSTRACT

An apparatus for the automatic feeding of a carrier to a laminating station. The apparatus has a gripper device which is fastened to two guide rods and which is movable to anf fro horizontally. Each of the guide rods is guided in a linear guide and is mounted in supports which are connected to one another by means of an angular cross-strut. A pneumatic cylinder is articulated centrally to the angular cross-strut by a lengthened piston rod. The gripper device grips the carrier at a predetermined distance ($X_{min}$) from the front edge, to transport it in the direction of a laminating station. A sensor for detecting the front edge of the carrier which is transported into the gripper device is located on a holding bracket fastened to a displaceable holding block. The upper and lower gripper strips each have a perforation in the center of their bevelled strip part. As soon as the front edge of the carrier interrupts the vertical beam path, the sensor generates a control pulse which closes the gripper device and which retains the carrier for the transport to the laminating station.

16 Claims, 8 Drawing Figures

APPARATUS FOR THE AUTOMATIC FEEDING OF A LAMINATING STATION

BACKGROUND OF THE INVENTION

The present invention relates to an apparatus for the automatic feeding of a carrier to a laminating station, with a gripper device which is movable to and fro horizontally.

European Patent Application No. 0,084,077 discloses an apparatus for the automatic feeding of carrier boards for printed electric circuits to a film roller mechanism, and in this apparatus there is above a board stack a holding device which is movable to and fro in a vertical direction relative to the board stack. The holding device receives two parallel horizontal guide rods carrying at their opposite ends piston/cylinder units, the piston rods of which have parallel cross-members which are arranged in a horizontal plane and on the free ends of which adjustable grippers are provided. The grippers are movable both horizontally and vertically. Arranged parallel to each cross-member is a displaceable roller table which can move in a horizontal plane out of a position of rest into a working position and vice versa. In the working position, the grippers transfer the carrier boards to the roller tables.

Carrier boards for printed circuits, after being cleaned, washed and dried, are supplied to a laminating station or to a film roller mechanism, in which a photoresist film is laminated onto the carrier board. The carrier boards are usually stacked, and it is known that the transport of the carrier boards for printed electric circuits from the stack to the laminating station presents difficulties inasmuch as the sensitive surface of the carrier boards may not be subjected to mechanical stress, to avoid scratches, indentations or impressions. The use of elastic rubber suckers also poses problems, since corresponding impressions of the rubber suckers can remain on the boards, and these can lead to soiling which could impair the reliable coating-on of the photoresist film in the roller mechanism. According to European Patent Application No. 0,084,077 mentioned above, these disadvantages are avoided by the provision of an automatic apparatus for feeding carrier boards for printed circuits to a laminating station. This feed apparatus operates with grippers which do not come into contact with the surfaces of the carrier boards, but only with the longitudinal edges of the carrier boards.

In general, such carrier boards, carriers, multi-layers or other boards to be laminated are transported from a heating station to the laminating station by means of guided fingers which rest against the rear edge of the board to be transported and which push the latter in the direction of the laminating station. Difficulties arise here when the board, because of its thinness, has only a low flexural rigidity, since this is then insufficient to guarantee that the front edge of the board will be introduced reliably into the nip between the laminating rollers of the laminating station. Because of this, the board can be drawn into the laminating station incorrectly, and this can cause damage to the board which then has to be separated out as a reject.

SUMMARY OF THE INVENTION

It is accordingly an object of the invention to provide an apparatus for feeding the front edge of boards, carriers and suchlike materials, generally having a low flexural rigidity, into a nip between two rollers of a laminating station with a high degree of aiming accuracy and reliability.

Another object of the invention is to provide an apparatus, as above, which makes it possible to position the front edge of boards, carriers, multi-layers and suchlike materials exactly and uniformly in relation to a gripper device, through which the materials extend in their transport direction and from which they project a predetermined amount.

These objects are achieved, according to the invention, by providing that the gripper device is fastened to two guide rods, each of which is guided in a linear guide, and by providing a pneumatic cylinder connected via a rod to the gripper device, the cylinder moving the gripper device towards or away from the laminating station.

More specifically, the invention provides for an apparatus for the automatic feeding of a carrier to a laminating station, comprising a gripper device movable in a horizontal direction, a pair of guide rods to which the gripper device is fastened, each of the guide rods being guided in a linear guide, and means for moving the gripper device towards or away from the laminating station, the means connected to the gripper device by a first connecting rod.

BRIEF DESCRIPTION OF THE DRAWINGS

The invention is explained in more detail below with reference to exemplary embodiments illustrated by the drawings.

In the drawings.

DETAILED DESCRIPTION OF THE PREFERRED EMBODIMENTS

Figure 1:
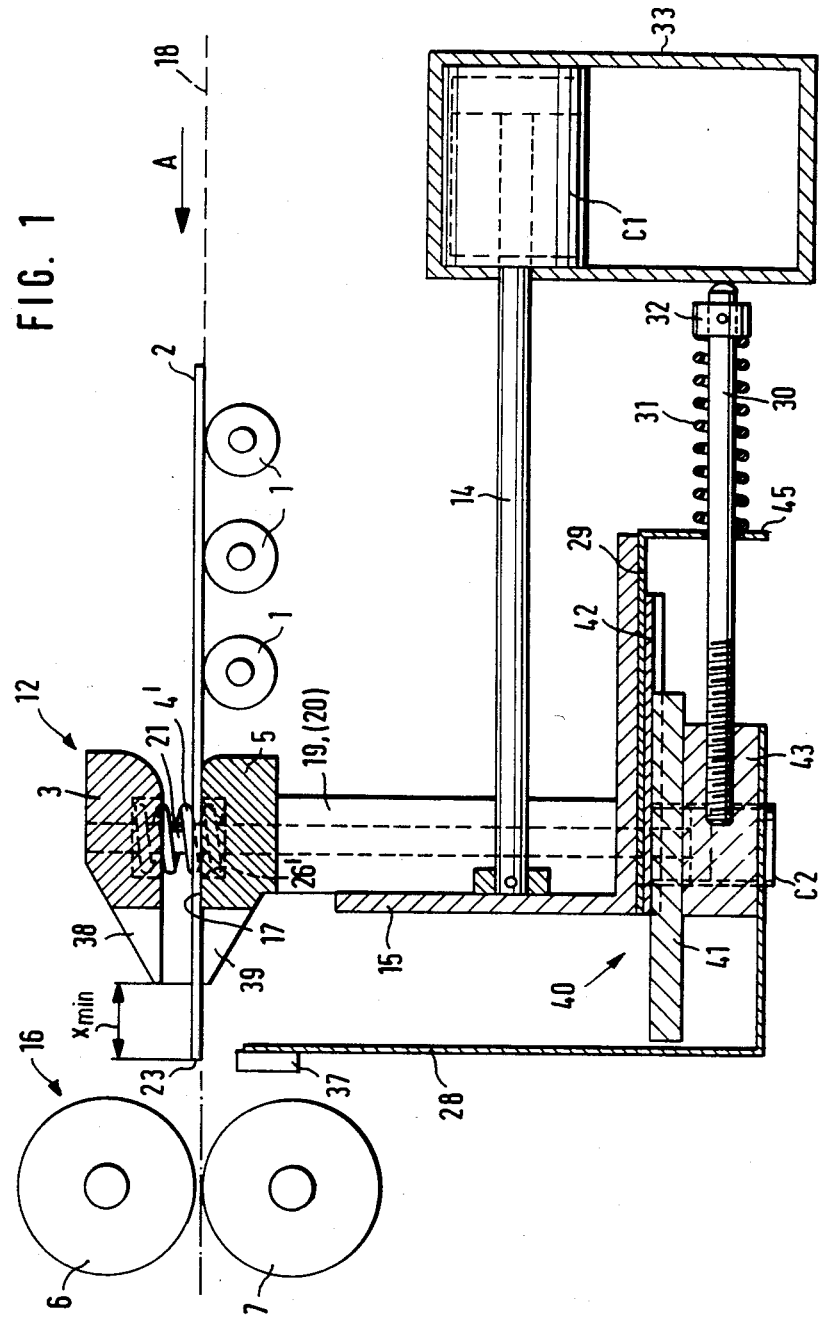
FIG. 1 shows a diagrammatic sectional view of a first embodiment of the apparatus according to the invention.

In one embodiment of the invention, a pneumatic cylinder is articulated by means of a rod onto a cross-strut of a gripper device in the center of the distance between two guide rods. The gripper device comprises two gripper strips which are arranged between a laminating station and horizontal transport rollers in such a way that a lower gripper strip lies with its supporting surface for a carrier in a transport plane predetermined by transport rollers. The upper vertically adjustable gripper strip is located above the transport plane when the gripper device is in the open position.

A further embodiment of the invention is defined by a sensor for detecting the front edge of the carrier, located on a holding bracket fastened to a holding block movable in the transport direction A of the carrier, and by the sensor, in the open position of the gripper device, being at an adjustable distance $X_{min}$ in front of the front edges of the gripper strips of the gripper device.

In an embodiment of the invention, a linear guide makes the connection between the holding block and a cross-strut which connects together the supports on which the lower gripper strip is fastened, and furthermore a part of the linear guide which is fixed in position is attached to the underside of a base plate connected to the underside of the angular cross-strut, and a movable part of the linear guide is fastened to the holding block.

In a development of the invention, the upper and lower gripper strips each have a perforation in the center of their bevelled strip part, so that, during the forward movement of the gripper device in the transport direction A, the sensor comes into the region of the perforation of the lower gripper strip, and the cross-strut of the gripper device rests against the holding bracket with the sensor and pushes the latter forward in the direction of the laminating station during the further forward movement of the gripper device.

To maintain the predetermined distance $X_{min}$, a stop rod parallel to the transport direction A is engaged with a threaded bore in the holding block and passes through an angled part of the base plate, and a setting ring is also located on the stop rod near to the free end.

Appropriately, between the setting ring and the angled base plate, the stop rod is surrounded by a spring which is supported at one end against the outside of the angled part of the base plate and at the other end against the setting ring. At the same time, the free end of the stop rod rests against a machine cross-piece, and the distance between the free end of the stop rod and the holding block or the front position of the sensor is pre-fixed.

In another embodiment of the invention, the free end of the stop rod rests against a stop which is screwed into the machine cross-piece and which is secured in its particular position by means of a lock nut. In this case, the distance between the angled part of the base plate and the movable part of the linear guide, when the stop rod rests against the stop or against the machine cross-piece, is greater than the distance $X_{min}$.

Turning to the figures, FIG. 1 shows, in section, a cut-out portion of a processing machine for carriers, multi-layers, carrier boards for printed circuits and suchlike materials. A carrier 2 is supplied in a transport plane 18 to a laminating station 16 comprising two laminating rollers 6 and 7. The transport plane 18 is a horizontal plane tangent to transport rollers 1. The peripheral speed of the laminating rollers 6 and 7 is usually greater than the transport speed of the carrier 2.

The lower laminating roller 7 is, for example, mounted fixed in place, while the upper laminating roller 6 is mounted so as to be movable in the vertical direction, thus making it possible to vary the nip between the laminating rollers within predetermined limits of, approximately, 0.5 to 7 mm. The laminating rollers 6 and 7 are driven at the same peripheral speed by a motor (not shown).

The carrier 2, for example a multi-layer, a carrier board for printed circuits, or such-like material, is transported from a heating station (not shown) in which the carrier is heated on both sides, in the transport plane 18 marked by a broken line, in the transport direction A over the transport rollers 1, one or more of which are driven, until the front edge of the carrier 2 interrupts the vertical beam path of a sensor 37, as a result of which the pneumatics of the gripper device 12 are subjected to a control signal from the sensor 37 and close the gripper device, to retain the carrier 2 for the purpose of subsequent introduction into the laminating station 16. The gripper device 12 consists of two gripper strips 3 and 5 and is arranged between the laminating station 16 and the horizontal transport rollers 1 in such a way that the lower gripper strip 5 lies in the transport plane 18 and the upper gripper strip 3, which is vertically adjustable, is located above the transport plane 18 when the gripper device 12 is in the open position. The gripper device 12 is displaceable to and fro horizontally by means of a pneumatic cylinder C1 connected to the gripper device 12 via a rod 14. The rod 14 is a lengthened piston rod of the pneumatic cylinder C1 which is located, for example, inside a machine cross-piece 33.

The sensor 37 for detecting the front edge of the carrier 2 is located on a holding bracket 28 fastened to the underside of a holding block 43. When the gripper device 12 is in the open position, the sensor 37 is at an adjustable distance $X_{min}$ in front of the front edges of the gripper strips 3 and 5 of the gripper device 12. The upper and lower gripper strips 3 and 5 each have in the center of their bevelled strip parts a perforation 38 and 39 respectively, through which the beam of the sensor 37 passes as soon as the gripper strips 3 and 5 come into the region of the sensor 37, as will be explained later.

The holding block 43 is displaceable to and fro in a horizontal direction. The connection between the holding block 43 and an angular cross-strut 15 is made by a linear guide 40 consisting of a part 42 fixed in position and a movable part 41. The part 42 fixed in position is attached to the underside of a base plate 29 connected to the underside of the cross-strut 15. The movable part 41 of the linear guide 40 is fastened to the holding block 43. The holding block has a threaded bore 35 which engages a stop rod 30 extending parallel to the transport direction A and underneath the rod 14 of the pneumatic cylinder C1. The stop rod 30 passes through an angled vertical part 45 of the base plate 29. Located on the stop rod 30 near to its free end is a setting ring 32, of which the position on the stop rod 30 is freely selectable and which is retained in its particular position by means of a countersunk grub screw. Between the setting ring 32 and the angled part 45 of the base plate 29, a spring 31 surrounds the stop rod 30. This spring 31 is supported at one end against the outside of the angled part 45 of the base plate 29 and at the other end against the setting ring 32. According to the particular setting or position of the setting ring 32 on the stop rod 30, the spring 31 is compressed to a greater or lesser extent by the angled part 45 of the base plate 29 during the movement of the piston rod 14 of the pneumatic cylinder C1 in the opposite direction to the transport direction A, the free end of the stop rod 30 resting against the machine cross-piece 33. The distance between the free end of the stop rod 30 and the holding block 43 of the front position of the sensor 37 is pre-fixed. This distance depends on how far the stop rod 30 is screwed into the threaded bore 35 of the holding block 43.

The distance between the angled part 45 of the base plate 29 and the movable part 41 of the linear guide 40, when the stop rod 30 rests against the machine cross-piece 33, is greater than the distance $X_{min}$.

The sensor 37, which is usually an optoelectronic sensor, is arranged so that its beam path is at the predetermined distance $X_{min}$ in front of the gripper device 12, when the latter, in the retracted state of the pneumatic cylinder C1, assumes its position furthest away from the laminating station 16. As soon as the front edge of the carrier 2 interrupts the beam path of the sensor 37, the gripper device 12 closes and the pneumatic cylinder C1 is extended in the direction of the laminating station 16. The front edge 23 is guided as far as possible into the nip between the laminating rollers 6 and 7 by the gripper device 12, this being made easier because of the bevelling of the gripper strips 3 and 5, and thus ensuring that, when the gripper device 12 is opened, the carrier is immediately taken up by the rotating laminating rollers and transported further.

During the forward movement of the gripper device 12 in the transport direction A, the part 42 of the linear guide 40 moves along the part 41 fastened to the holding block 43, the sensor 37 or the holding bracket 28 initially maintaining its position unchanged. During the further forward movement of the gripper device 12 in the transport direction A, the cross-strut 15 of the gripper device comes up against the holding bracket 28 with the sensor 37, the latter consequently coming into the region of the perforation 39 of the lower gripper strip 5, although this is not illustrated in FIG. 1. During the further forward movement of the gripper device, the sensor is then also pushed forwards in the direction of the laminating station 16. As soon as the carrier 2 has been transferred to the laminating station 16, the opened gripper device 12 is moved back to the right in FIG. 1 by the pneumatic cylinder C1, and the free end of the stop rod 30 comes up against the machine cross-piece 33. The sensor 37 and the holding bracket 28 then resume their initial position, in which the position of the sensor 37 in front of the front edges of the gripper strips 3 and 5 is pre-fixed.

Figure 2:
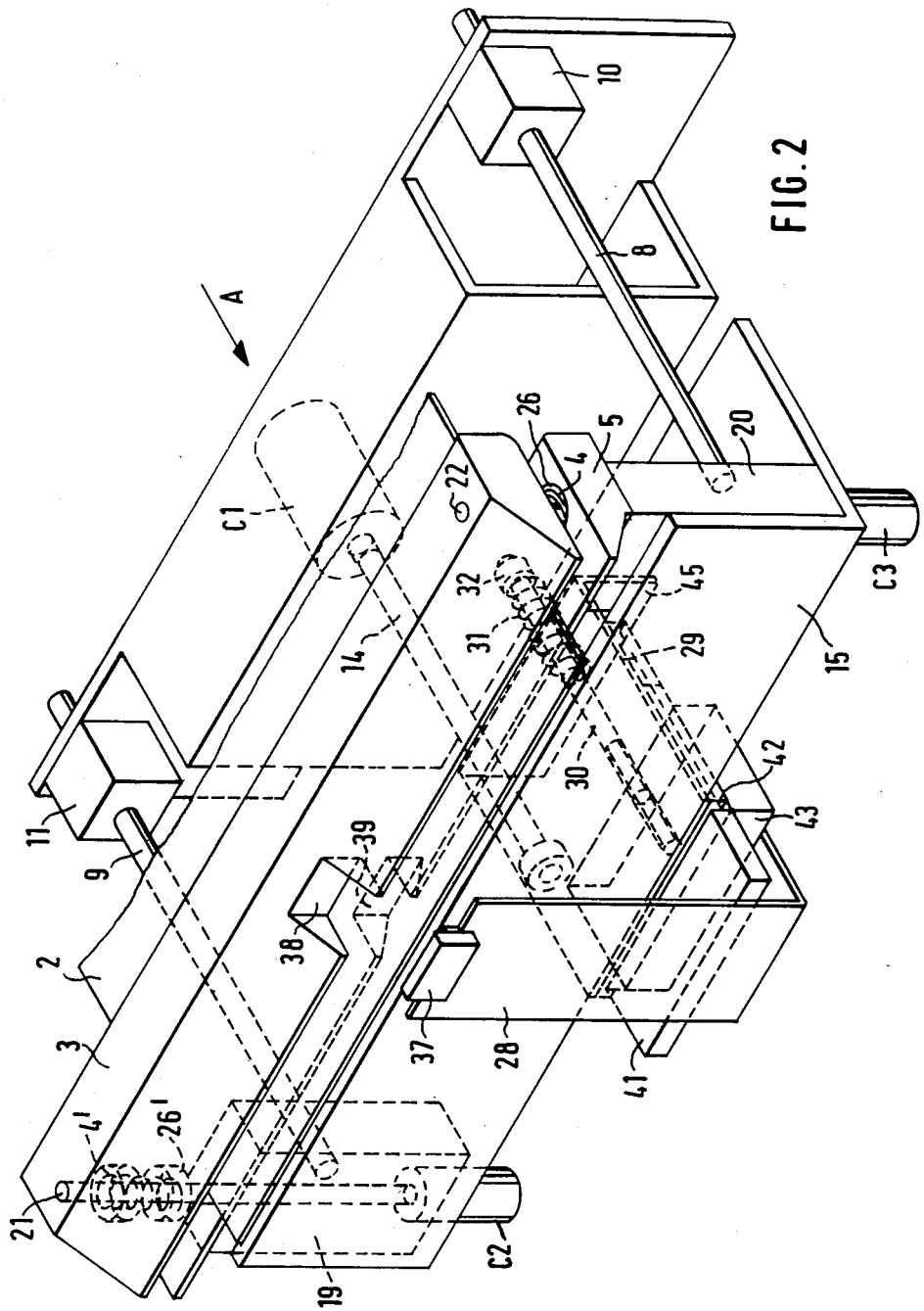
FIG. 2 shows a perspective view of the embodiment according to FIG. 1.

In FIG. 2, the laminating station 16, the transport rollers 1, the machine cross-piece 33 and the stop rod 30 which are shown in FIG. 1 are omitted for the sake of greater clarity.

As FIG. 2 shows, the lower gripper strip 5 is fixed in position and rests on two supports 19, 20 by means of its underside located opposite the supporting surface for the carrier 2. The pneumatic cylinder C1 is articulated centrally on the cross-strut 15 of the gripper device 12 by means of the rod 14. The gripper device 12 is connected to two guide rods 8 and 9, each of which is guided in a linear guide 10 and 11. The guide rods 8 and 9 are mounted in the supports 19 and 20, on which the lower gripper strip 5 is fastened by means of the outer ends of its underside. The cross-strut 15 connects the two supports 19 and 20 to one another and possesses in the center two projections which are provided at right angles to the cross-strut 15 and between which the rod 14 of the pneumatic cylinder C1 is inserted and articulated (not shown in FIG. 1). Each of the supports 19 and 20 has a through-hole, through which is guided a rod 21 or 22 connected at the bottom end to a pneumatic cylinder C2 or C3 respectively and at the top end to the upper gripper strip 3. In the supporting surface 17 of the lower gripper strip 5, recesses 26, 26' are arranged all round the rods 21 and 22 which are surrounded in this region by springs 4, 4'. The top ends of the springs are supported in recesses in the upper gripper strip 3 and the bottom ends are supported on or connected to the bottom surfaces of the recesses 26, 26' of the lower gripper strip 5. The springs 4, 4' can be tension springs or compression springs. When tension springs are used, these pull the upper gripper strip 3 against the lower gripper strip 5 when the pneumatic cylinders C2 and C3 are pressureless. When the pneumatic cylinders C2 and C3 are subjected to pressure, the upper gripper strip 3 is displaced upwardly into the open position of the gripper device 12 against the pulling force of the springs 4, 4'.

If the springs 4, 4' are compression springs which, when the pneumatic cylinders C2 and C3 are pressureless, lift the upper gripper strip 3 off from the lower gripper strip 5, then, when the pneumatic cylinders C2 and C3, which in this case have to operate in reverse to the pneumatic cylinders C2 and C3 for tension springs, are subjected to pressure, the upper gripper strip 3 moves downwardly into the closing position of the gripper device 12 against the compressive force of the springs.

Figure 3:
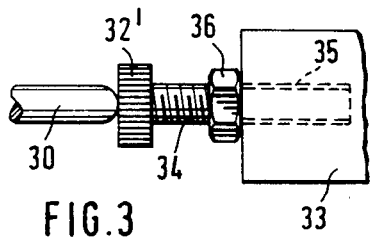
FIG. 3 shows an enlarged view of a detail of a second embodiment differing in this detail only from the first and third embodiments.

FIG. 3 shows, in an enlarged view, a detail of a second embodiment of the invention. This detail can be provided both in the first embodiment according to FIGS. 1 and 2, and in a third embodiment according to FIG. 4. The detail consists of a stop 34 which is screwed into the machine cross-piece 33 and which is secured in its particular position by a lock nut 36. For this purpose, there is in the machine cross-piece 33 a threaded bore 35, into which the stop 34 can be screwed to different depths. Located on the free end of the stop 34 is a setting ring 32', against which the free end of the stop rod 30 rests in the initial position of the gripper device. As a result of the adjustment of the stop 34 within the threaded bore 35, the distance $X_{min}$ of the sensor 37 from the front edges of the gripper strips 3 and 5 can be varied within a predetermined range.

Figure 4:
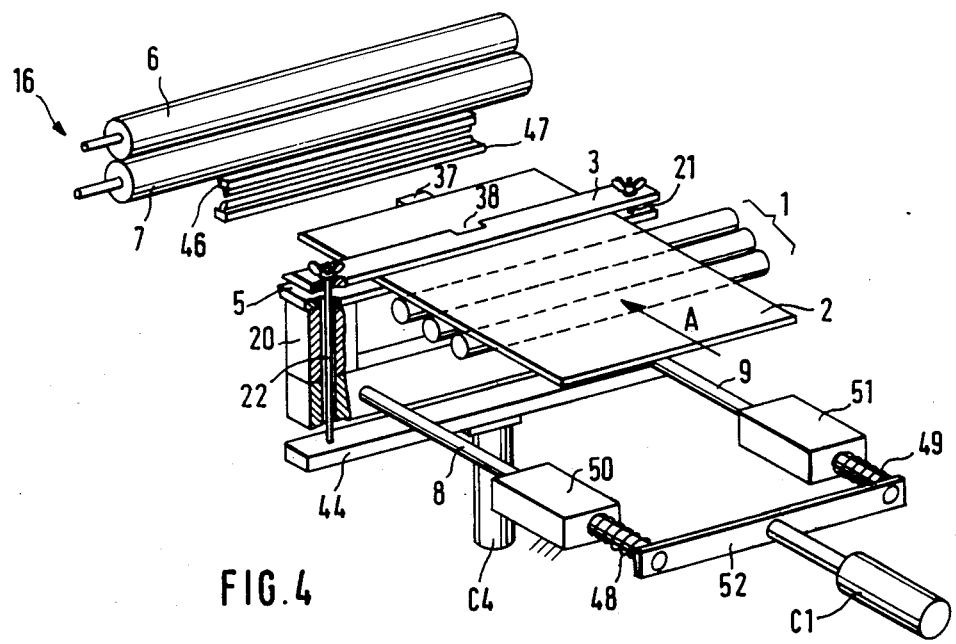
FIG. 4 shows a perspective view of a third embodiment which is modified slightly in relation to the first and second embodiments.

The embodiment illustrated in FIG. 4, in which the base plate, the stop rod 30 and the machine cross-piece 33 have been omitted for the sake of greater clarity, has a similar design to that of the first embodiment, the only difference being that, instead of two pneumatic cylinders C2, C3, a single pneumatic cylinder C4 is connected centrally to a cross-piece 44 in order to move the latter up and down. When retracted, the pneumatic cylinder C4, via the cross-piece 44 and the rods 21, 22 which are screwed, for example, by means of wing nuts to the top side of the upper gripper strip 3, transmits the pulling force to the gripper strip 3 for the closing operation of the gripper device.

In this embodiment, coating devices 46, 47 are arranged immediately in front of the laminating station 16, so that a liquid can be coated on the top side and underside of the carrier 2. The two horizontal guide rods 8 and 9 parallel to one another pass through guide bearings 50 and 51 and are connected to one another at the rod ends, for example by means of a cross-strut 52. The piston rod of the pneumatic cylinder C1 engages on the rear side of the cross-strut 52 to move the gripper device to and fro horizontally. The guide rods 8 and 9 project to the rear beyond the guide bearings 50 and 51 and are surrounded by springs 48 and 49 which rest at one end against the rear sides of the guide bearings 50 and 51 and at the other end against the cross-strut 52. When the pneumatic cylinder C1 is pressureless, the gripper device is displaced by the springs 48 and 49 into a predetermined position in the transport direction A.

The remaining components illustrated in FIG. 4 correspond substantially to those in FIGS. 1 and 2 and are therefore not described in any more detail.

Figure 5:
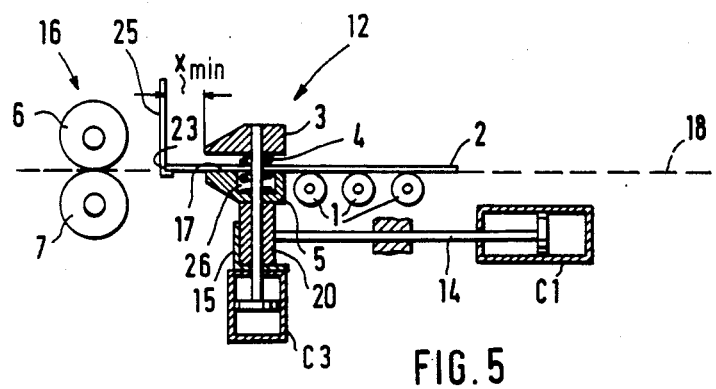
FIG. 5 shows a diagrammatic sectional view of a fourth embodiment of the apparatus according to the invention.

FIG. 5 shows, in a diagrammatic sectional view, a further embodiment of the feed apparatus similar to the apparatus according to FIG. 1. The carrier 2 is supplied in the transport plane 18 to the laminating station 16 comprising two laminating rollers 6 and 7.

The carrier 2, for example a multi-layer, a carrier board for printed circuits or such-like material, is transported from a heating station (not shown) in which the carrier is heated on both sides, in the transport plane 18 marked by a broken line over the transport rollers 1, one or more of which are driven, up to a stop 25. The angular stop 25 projects into the path of the carrier 2 and is connected to a pneumatic cylinder (not shown) having a solenoid valve which pulls it out of the path when the solenoid valve is subjected to an appropriate control pulse.

The gripper device 12 comprises two gripper strips 3 and 5 and is arranged between the laminating station 16 and the horizontal transport rollers 1 in such a way that the lower gripper strip 5 lies in the transport plane 18 and the upper gripper strip 3, which is vertically adjustable, is located above the transport plane 18 when the gripper device 12 is in the open position. The gripper device 12 is displaceable to and fro horizontally by means of a pneumatic cylinder C1 connected to the gripper device 12 via a rod 14. The rod 14 is a lengthened piston rod of the pneumatic cylinder C1. The stop 25 is arranged so that the front edge 23 of the carrier 2 is at a predetermined distance $X_{min}$ in front of the gripper device 12, when the latter, in the retracted state of the pneumatic cylinder C1, assumes its position furthest away from the laminating station 16. As soon as the gripper device 12 closes, the stop 25 is pulled out of the transport plane 18 or out of the path of the carrier 2 and the pneumatic cylinder C1 is extended in the direction of the laminating station 16. The front edge 23 is introduced as far as possible into the nip between the laminating rollers 6 and 7 by the gripper device 12, thus ensuring that, when the gripper device 12 opens, the carrier 2 is immediately taken up by the rotating laminating rollers and transported further. The distance $X_{min}$ is selected so as to correspond approximately to the radius of the laminating rollers 6 and 7, thus ensuring, even when the flexural rigidity of thin carriers 2 is low, that the carrier 2 will be transferred accurately from the gripper device 12 to the laminating station 16. Since the maximum distance $X_{min}$ is of the order of 3 to 4 cm, there is no sag even when the flexural rigidity of the carrier 2 is only low, so that the front edge 23 of the carrier 2 can be introduced accurately into the nip between the laminating rollers, and the carrier 2 is transferred from the gripper device 12 to the laminating station 16 in a substantially fault-free manner.

The lower gripper strip 5 is fixed in position and lies, by means of its supporting surface 17 for the carrier 2, in the transport plane 18 predetermined by the transport rollers 1.

Figure 6:
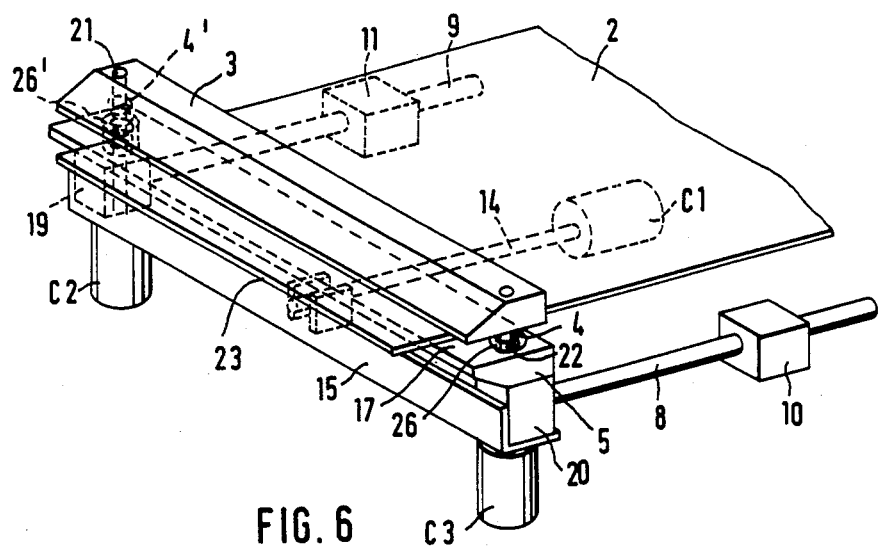
FIG. 6 shows a perspective view of the apparatus according to FIG. 5.

As FIG. 6 shows, the pneumatic cylinder C1 is articulated by means of the rod 14 on the cross-strut 15 of the gripper device 12 in the center of the distance between two guide rods 8 and 9. The gripper device 12 is fastened to the two guide rods 8 and 9, each of which is guided in a linear guide 10 and 11. Furthermore, the guide rods 8 and 9 are mounted in supports 19 and 20, on which the lower gripper strip 5 is fastened by means of its outer ends. The angular cross-strut 15 connects the two supports 19 and 20 to one another and possesses in the center two projections which are provided at right angles to the cross-strut 15 and between which the rod 14 of the pneumatic cylinder C1 is inserted and articulated. Each of the supports 19 and 20 has a through-hole, through which is guided a rod 21 or 22 connected to a pneumatic cylinder C2 or C3 respectively at the bottom end and to the upper gripper strip 3 at the top end. In the supporting surface 17 of the lower gripper strip 5, recesses 26, 26' are arranged all round the rods 21 and 22 which are surrounded in this region by springs 4, 4'. The top ends of the springs are connected to the upper gripper strip 3 and the bottom ends are connected to the bottom surfaces of the recesses 26, 26' of the lower gripper strip 5. The springs 4, 4' can be tension springs or compression springs. When tension springs are used, these pull the upper gripper strip 3 against the lower gripper strip 5 when the pneumatic cylinders C2 and C3 are pressureless. When the pneumatic cylinders C2 and C3 are subjected to pressure, the upper gripper strip 3 is displaced upwardly into the open position of the gripper device 12 against the pulling force of the springs 4, 4'.

The springs 4, 4' can be compression springs which, when the pneumatic cylinders C2 and C3 are pressureless, lift the upper gripper strip 3 off from the lower gripper strip 5. When the pneumatic cylinders C2 and C3, which in this case have to operate in reverse to the pneumatic cylinders C2 and C3 for tension springs, are subjected to pressure, the upper gripper strip 3 is moved downwardly into the closing position of the gripper device 12 against the compressive force of the springs.

Figure 7:
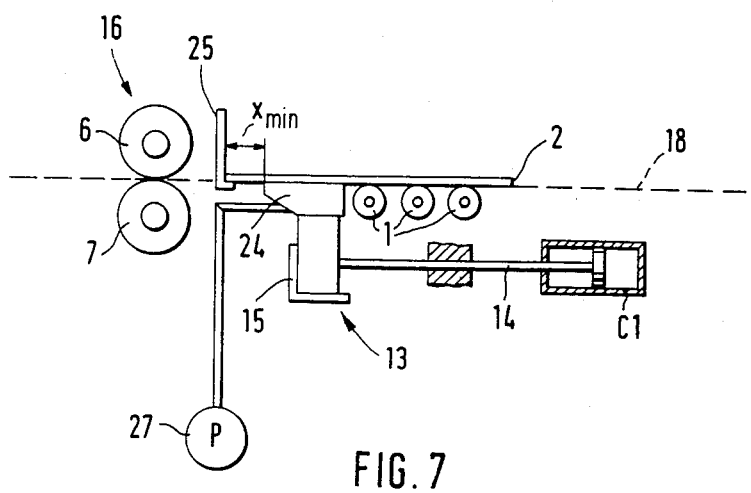
FIG. 7 shows a diagrammatic sectional view of a fifth embodiment of the apparatus according to the invention.
Figure 8:
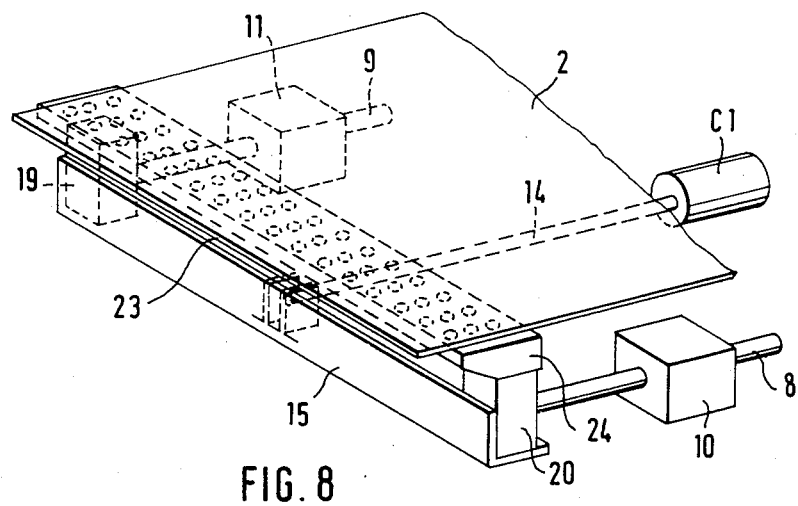
FIG. 8 shows a perspective view of the apparatus according to FIG. 7.

FIGS. 7 and 8 illustrate a further embodiment of a gripper device 13 which has a similar design to that of the gripper device 12 according to FIGS. 5 and 6. Identical components of the two gripper devices bear the same reference numerals and are not described again.

In comparison with the gripper device 12 according to FIGS. 5 and 6, the differences are that the gripper device 13 has a single strip 24 designed as a suction strip, and that the pneumatic cylinders C2 and C3, together with the upper gripper strip, are omitted. The strip 24 is connected to a vacuum or suction pump 27 which produces a partial vacuum in the suction strip 24 when the carrier 2 is to be retained. For this purpose, there is a suction surface of the strip 24, in which suction holes of relatively small diameter are arranged. As soon as the vacuum pump is switched on, a partial vacuum is generated in the strip 24, and the carrier 2 is sucked against the suction surface and retained. The suction surface lies in the transport plane 18 formed by the transport rollers 1 and is at a predetermined distance $X_{min}$ from the front edge 23 of the carrier 2. As soon as the strip 24 is subjected to a partial vacuum, to suck up the carrier 2 for further transport to the laminating station 16, the stop 25 is pulled out of the transport plane 18 and the gripper device 13 is displaced in the direction of the laminating station 16 by the pneumatic cylinder C1 which is articulated to the angular cross-strut 15 via the rod 14. The further transport of the carrier 2 through the laminating station 16 takes place in the way described above with reference to FIGS. 5 and 6.

The gripper strips 3 and 5 of the gripper device 12 according to FIGS. 5 and 6 are of equal length and extend beyond the width of the carrier, that is to say beyond the two edges, in the longitudinal direction of the carrier. Thus, the gripper strips form engagement surfaces which are continuous over the entire width of the carrier, thus providing, in comparison with gripper devices engaging at various points, the advantage of a desirable stiffening of the front edge of the carrier during transport, especially where a multi-layer is concerned.

In FIGS. 6 and 8, the transport rollers have been omitted for the sake of greater clarity.

What is claimed is:

1. An apparatus for the automatic feeding of a carrier to a laminating station, comprising:
    a gripper device movable in a horizontal direction;
    a pair of guide rods to which said gripper device is fastened, each of said guide rods being guided in a linear guide;
    means for moving said gripper device towards or away from the laminating station, said means connected to said gripper device by a first connecting rod;
    a sensor which detects the front edge of said carrier, said sensor being located on a holding bracket fastened to a holding block movable in the transport direction of the carrier, said sensor being at an adjustable distance in front of the front edges of the gripper strips of said gripper device in its open position;
    a linear guide connecting said holding block and a cross-strut, a part of said linear guide being fixed in position and attached to the underside of a base plate connected to the underside of said cross-strut; and
    a movable part of said linear guide being fastened to said holding block.

2. The apparatus as claimed in claim 1, wherein said means for moving said gripper is a first pneumatic cylinder articulated by means of said connecting rod to a cross-strut of said gripper device in the center of the distance between said pair of guide rods.

3. The apparatus as claimed in claim 2, wherein the gripper device comprises upper and lower gripper strips arranged between the laminating station and a plurality of horizontal transport rollers in such a way that the lower gripper strip lies with its continuous supporting surface, projecting beyond the width of the carrier on both sides, in the transport plane predetermined by the transport rollers, and wherein the upper vertically adjustable continuous gripper strip is of the same length as the lower gripper strip and is located above the transport plane when the gripper device is in the open position.

4. The apparatus as claimed in claim 3, wherein said apparatus further includes:
    a pair of supports, said supports connected to said cross-strut, each said support fastened to an outer end of said lower gripper strip and having a through-hole; and
    second and third pneumatic cylinders, each of said second and third pneumatic cylinders communicating with separate outer ends of said upper gripper strip by means of second and third connecting rods, each said second and third rod passing through a through-hole in said support.

5. The apparatus as claimed in claim 4, wherein said second and third rods are surrounded in the upper region by springs which are connected at their top end to said upper gripper strip and at their bottom end to bottom surfaces of recesses in said lower gripper strip.

6. The apparatus as claimed in claim 5, wherein said springs are tension springs which pull said upper gripper strip against said lower gripper strip, and wherein, when said second and third pneumatic cylinders are subjected to pressure, said upper gripper strip is displaced upwardly into the open position of said gripper device against the pulling force of said springs.

7. The apparatus as claimed in claim 5, wherein said springs are compression springs which lift the upper gripper strip off from said lower gripper strip, and wherein, as a result of the actuation of said second and third pneumatic cylinders, said upper gripper strip is movable downwardly into the closing position of said gripper device against the compressive force of said springs.

8. The apparatus as claimed in claim 1, wherein said gripper device grips the carrier at a predetermined distance from the front edge of said carrier.

9. The apparatus as claimed in claim 2, wherein the gripper device has a single strip which is designed as a suction strip.

10. The apparatus as claimed in claim 9, wherein said single strip lies with its suction surface in the transport plane formed by said transport rollers and wherein said single strip can be subjected to a partial vacuum at a predetermined distance from the front edge of the carrier to suck up said carrier for further transport to the laminating station.

11. The apparatus as claimed in claim 1,
    wherein said upper and lower gripper strips each have a beveled strip part and a perforation in the center of said bevelled strip part,
    wherein said sensor comes into the region of the perforation of said lower gripper strip during the forward movement of the gripper device in the transport direction, and
    wherein the cross-strut of the gripper device rests against said holding bracket with said sensor and pushes the latter forward in the direction of the laminating station during the further forward movement of said gripper device.

12. The apparatus as claimed in claim 1, wherein a stop rod parallel to the transport direction is engaged with a threaded bore in said holding block and passes through an angled part of the base plate, and wherein a setting ring is located on the stop rod near to a free end of said stop rod.

13. The apparatus as claimed in claim 12, wherein, between the setting ring and the angled base plate, the stop rod is surrounded by a spring which is supported at one end against the outside of the angled part of the base plate and at the other end against the setting ring.

14. The apparatus as claimed in claim 12, wherein the free end of the stop rod rests against a machine cross-piece, and wherein the distance between the free end of the stop rod and the holding block or the front position of the sensor is pre-fixed.

15. The apparatus as claimed in claim 12, wherein the free end of the stop rod rests against a stop which is screwed into the machine cross-piece and which is secured in its particular position by a lock nut.

16. The apparatus as claimed in claim 14, wherein a distance between said angled part of the base plate and the movable part of said linear guide, when the stop rod rests against said stop or against said machine cross-piece, is greater than said predetermined distance.

* * * * *